United States Patent
Boillot et al.

(10) Patent No.: US 10,094,851 B2
(45) Date of Patent: Oct. 9, 2018

(54) MICRO-ELECTROMECHANICAL DEVICE COMPRISING A MOBILE MASS THAT CAN MOVE OUT-OF-PLANE

(71) Applicants: Tronic's Microsystems, Crolles (FR); Commissariat A L'Energie Atomique Et Aux Energies Alternatives, Paris (FR)

(72) Inventors: Francois-Xavier Boillot, Rennes (FR); Remi Laoubi, La Motte Servolex (FR); Guillaume Jourdan, Grenoble (FR)

(73) Assignees: Tronic's Microsystems, Crolles (FR); Commissariat A L'Energie Atomique Et Aux Energies Alternatives, Paris (FR)

( * ) Notice: Subject to any disclaimer, the term of this patent is extended or adjusted under 35 U.S.C. 154(b) by 249 days.

(21) Appl. No.: 14/647,651

(22) PCT Filed: Dec. 24, 2013

(86) PCT No.: PCT/FR2013/053265
§ 371 (c)(1),
(2) Date: May 27, 2015

(87) PCT Pub. No.: WO2014/102507
PCT Pub. Date: Jul. 3, 2014

(65) Prior Publication Data
US 2015/0309069 A1    Oct. 29, 2015

(30) Foreign Application Priority Data
Dec. 27, 2012    (FR) ..................... 12 62882

(51) Int. Cl.
*G01P 15/08*    (2006.01)
*B81B 3/00*    (2006.01)
(Continued)

(52) U.S. Cl.
CPC ........ *G01P 15/0802* (2013.01); *B81B 3/0051* (2013.01); *G01P 15/123* (2013.01);
(Continued)

(58) Field of Classification Search
CPC .... G01P 15/0802; G01P 15/18; G01P 15/123; G01P 15/125; G01P 2015/0817;
(Continued)

(56) References Cited

U.S. PATENT DOCUMENTS 5,962,786 A * 10/1999 Le Traon ............. G01P 15/097
   310/323.01
6,481,283 B1 * 11/2002 Cardarelli .......... G01C 19/5719
   73/504.02
(Continued)

FOREIGN PATENT DOCUMENTS

EP    2211185 A1    7/2010
EP    2367015 A1    9/2011

OTHER PUBLICATIONS

European Patent Office International Search Report for corresponding International Application No. PCT/FR2013/053265, dated Mar. 19, 2014, in the French and English languages (5 pgs).

*Primary Examiner* — David Bolduc
(74) *Attorney, Agent, or Firm* — Harris Beach PLLC

(57) ABSTRACT

The invention relates to a micro-electromechanical device used as a force sensor, comprising a mobile mass connected to at least one securing zone by means of springs or deformable elements, and means for detecting the movement of the mobile mass, the mobile mass having an outer frame and an inner body, the outer frame and the inner body being connected by at least two flexible portions forming integral decoupling springs on two separate sides of the outer frame.

15 Claims, 4 Drawing Sheets

(51) Int. Cl.
  *G01P 15/12* (2006.01)
  *G01P 15/125* (2006.01)
  *G01P 15/18* (2013.01)

(52) U.S. Cl.
  CPC ............ *G01P 15/125* (2013.01); *G01P 15/18* (2013.01); *B81B 2201/025* (2013.01); *B81B 2203/0154* (2013.01); *B81B 2203/0163* (2013.01); *B81B 2203/051* (2013.01); *B81B 2203/058* (2013.01); *G01P 2015/0817* (2013.01); *G01P 2015/0871* (2013.01)

(58) Field of Classification Search
  CPC ........... G01P 2015/0871; B81B 3/0051; B81B 2203/0154; B81B 2203/0163; B81B 2203/051; B81B 2203/058; B81B 2201/025
  See application file for complete search history.

(56) References Cited

U.S. PATENT DOCUMENTS

| | | | | |
|---|---|---|---|---|
| 2001/0025530 A1* | 10/2001 | Sakai | ............... | B81B 3/0008 73/514.32 |
| 2005/0005698 A1* | 1/2005 | McNeil | ............... | G01P 15/125 73/514.32 |
| 2005/0092086 A1* | 5/2005 | Chen | ............... | G01C 19/5719 73/514.32 |
| 2007/0034007 A1* | 2/2007 | Acar | ............... | G01P 15/0888 73/514.01 |
| 2007/0193355 A1* | 8/2007 | Axelrod | ............... | G01P 15/125 73/514.32 |
| 2008/0092652 A1* | 4/2008 | Acar | ............... | G01P 15/125 73/504.02 |
| 2009/0064784 A1* | 3/2009 | Wang | ............... | G01P 15/125 73/514.32 |
| 2009/0159997 A1* | 6/2009 | Okudo | ............... | B81C 1/00269 257/415 |
| 2010/0078740 A1* | 4/2010 | Cazzaniga | ............... | B81B 3/0013 257/415 |
| 2010/0186508 A1* | 7/2010 | Guenther | ............... | G01C 25/00 73/504.14 |
| 2011/0030473 A1* | 2/2011 | Acar | ............... | G01C 19/5712 73/504.12 |
| 2011/0219875 A1* | 9/2011 | Walther | ............... | B81B 3/0051 73/514.29 |
| 2012/0055249 A1* | 3/2012 | Miyatake | ............... | B81B 3/001 73/514.32 |
| 2012/0073370 A1 | 3/2012 | Schubert et al. | | |
| 2012/0216616 A1* | 8/2012 | Schultz | ............... | G01P 15/125 73/514.38 |
| 2013/0000411 A1* | 1/2013 | Robert | ............... | G01L 9/0052 73/708 |
| 2013/0192369 A1* | 8/2013 | Acar | ............... | G01P 15/18 73/514.01 |
| 2013/0205897 A1* | 8/2013 | Deimerly | ............... | G01C 19/5712 73/504.12 |
| 2013/0247666 A1* | 9/2013 | Acar | ............... | G01C 19/5755 73/514.01 |
| 2014/0331770 A1* | 11/2014 | Jourdan | ............... | B81B 3/0051 73/514.01 |

* cited by examiner

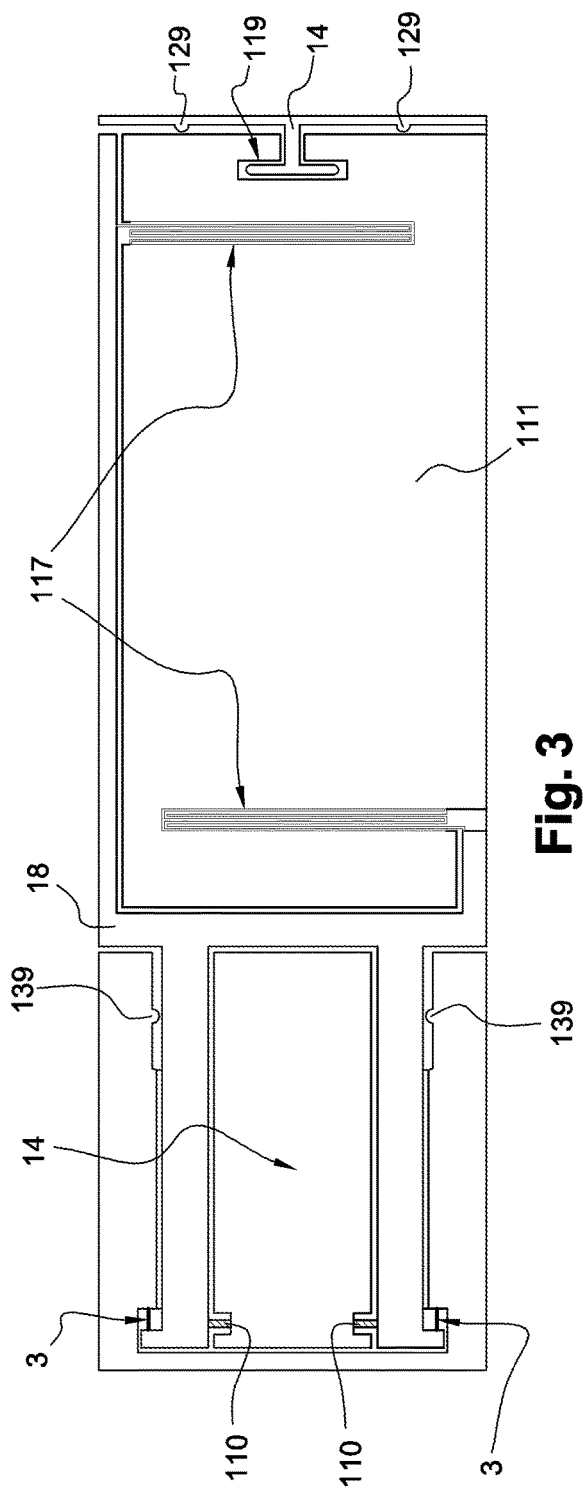
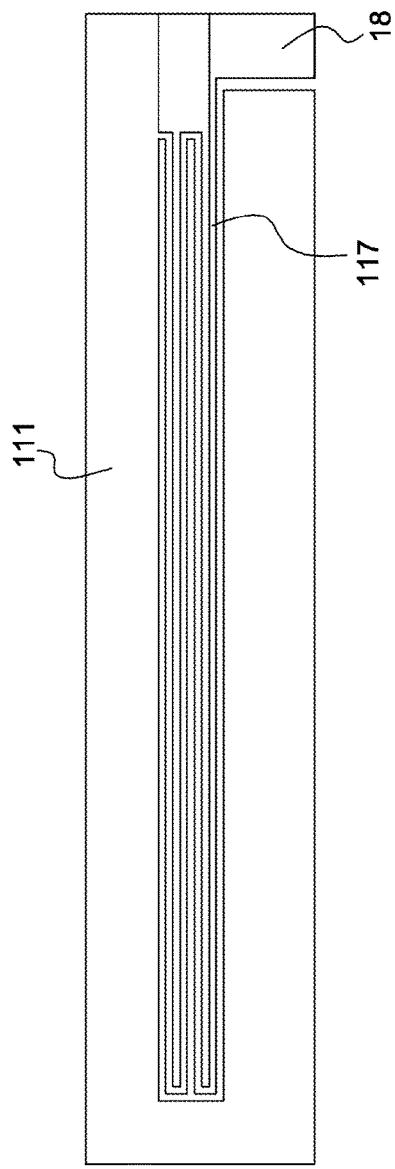
Fig. 3
Fig. 4

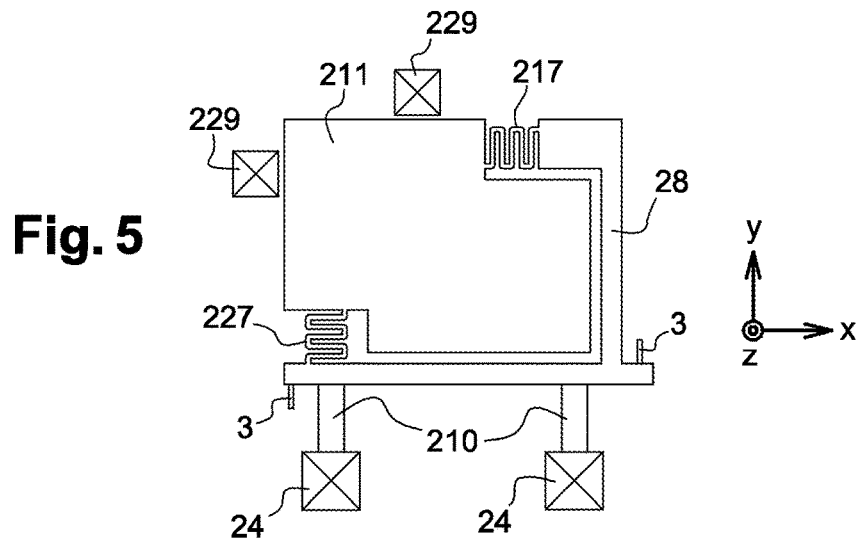
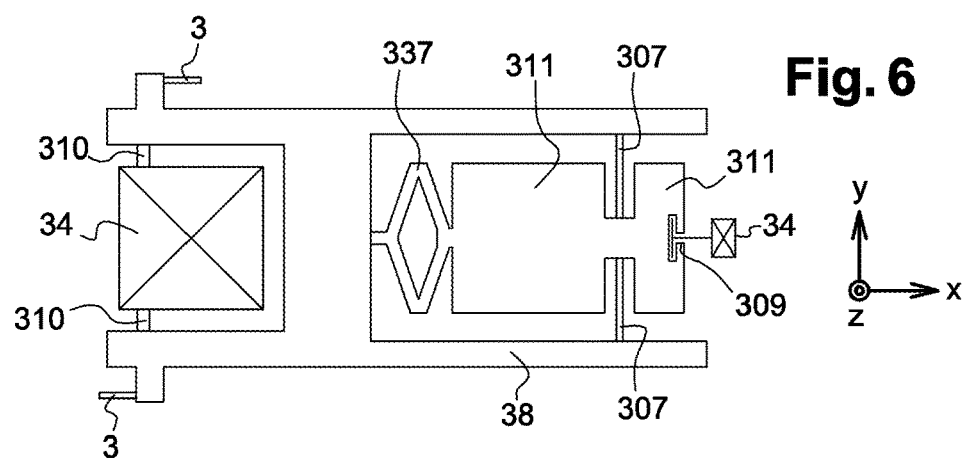
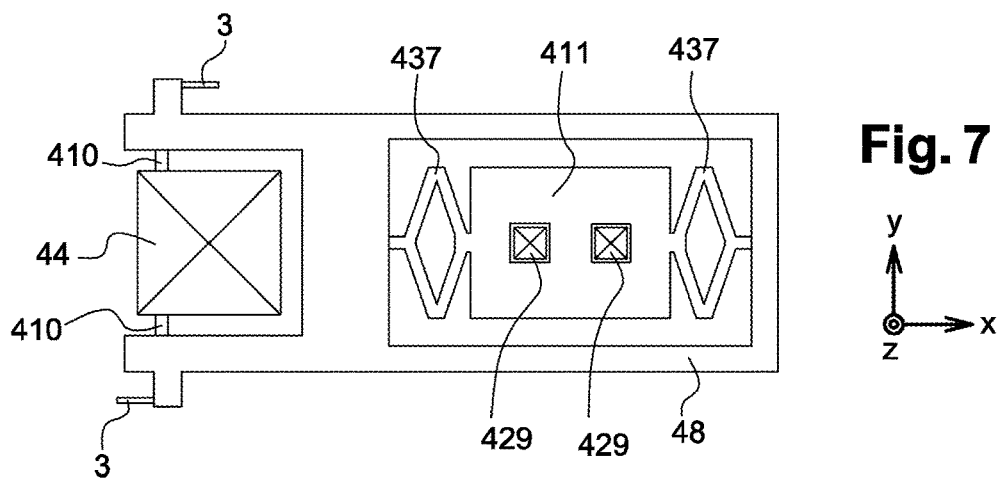

MICRO-ELECTROMECHANICAL DEVICE COMPRISING A MOBILE MASS THAT CAN MOVE OUT-OF-PLANE

CROSS-REFERENCE TO RELATED APPLICATIONS

This application is a national stage application under 35 U.S.C. § 371 of PCT Application No. PCT/FR2013/053265, filed on Dec. 24, 2013, which claims priority to and the benefit of French Application No. 1262882 filed on Dec. 27, 2012, which are incorporated herein by reference in their entirety.

FIELD OF THE INVENTION

The present invention relates to micro-electromechanical systems, otherwise called MEMS. It more specifically relates to a micro-electromechanical structure of force sensor type where the deformable elements and gauges forming the sensor are protected from ruptures which may result from strong mechanical stress exerted on said force sensor.

The invention particularly applies, for example, to accelerometers, gyrometers, and magnetometers, or even pressure sensors, and more generally to any device where a displacement of a mobile portion consecutive to the application of forces of various natures is desired to be measured.

STATE OF THE ART

Since the moment when sophisticated etching and growth techniques used, in particular, in microelectronics, have appeared, the possibility of manufacturing micro- and nano-electromechanical machines or sensors has become a reality. Such devices arouse a great interest due to their variety of applications, in the field of sensors, as well as in that of emitters, actuators, or passive devices. They are for example used in the automobile industry, aeronautics, or cell phones, to replace more bulky macroscopic devices.

Among micro-electromechanical sensors, force sensors, such as for example accelerometers, gyrometers, or magnetometers, are typically available in the form of devices comprising a mobile mass, and detection means measuring the displacements of this mobile mass under the effect of a force.

As shown in FIG. 1, mobile mass 1 of a force sensor generally appears in the form of a layer of a semiconductor material, and in particular of silicon, having a thickness in the order of one or more tens of microns, and maintained above a substrate 5 by elements 2, which may be flexibly or torsionally deformed, around a swivel axis. Deformable elements 2 are often called springs and are advantageously located at the level of one of the lateral ends of mobile mass 1. Springs 2 are themselves connected to fixed anchoring areas 4 attached to the substrate. Three axes x, y, z, such as shown in FIG. 1 are now defined, axis x being directed along the swivel axis of mobile mass 1, axis y being oriented along the plane of mobile mass 1 at rest and perpendicularly to axis x, and axis z being oriented perpendicularly to the plane defined by mobile mass 1 at rest and running from substrate 5 to mobile mass 1. Advantageously, this type of device is formed from a substrate of silicon-on-insulator type (SOI), an electrically-insulating oxide layer 6 separating the silicon layer, from which mobile mass 1 is etched, from substrate 5.

The detectors of the motion of the mobile mass are generally in the form of capacitive systems, where the displacements of the mobile mass drive two electrodes of the capacitive system away from each other or closer to each other, thus causing a variation of the air gap, and thus of the capacitance of the described system. An example of such detectors is available in document U.S. Pat. No. 4,736,629. As a variation, there exist force sensors using one or a plurality of piezoresistive gauges 3 sensitive in compression and in tension to the displacements of mobile mass 1, such as that shown in FIG. 1. In both cases, the sensitivity of the force sensor is determined by the amplitude of the displacement allowed by the mobile mass, and by the positioning of the detectors of the motion of the mobile mass. It is also possible to use mechanical resonators as strain gauges, the resonance frequencies of the resonators changing according to the strain which is applied thereto.

Piezoresistive gauges 3 are advantageously placed so that to increase as much as possible the compressive and tensile strain applied to gauges 3. Such an operation aims at increasing the detection sensitivity of the force sensor.

Indeed, the strain generated by compressive/tensile deformations in gauges 3 induce a variation of the resistance of gauges 3 proportional to the strain. By applying a voltage across a piezoresistive gauge 3, it is then possible to detect the associated resistance variation, which is induced by the displacement of mobile mass 1 and proportional to the applied deformation. The displacement of mobile mass 1 being due to an external force applied thereto, the use of piezoresistive strain gauges enables to know the value of a force based on a measurement of the resistance variation. The larger the resistance variation per force unit, the more sensitive the micro-electromechanical force sensor. Force sensors with piezoresistive gauges 3 with an out-of-plane displacement of the mobile mass, such as those for example described in documents FR 2954505 and FR 2941533, naturally suggest to place piezoresistive gauges 3 aligned with the upper and/or lower surfaces of the mobile mass along axis z, in the vicinity of an anchor point, to undergo maximum compressions and tensions without however exceeding a rupture threshold, as shown in FIG. 1.

It is however possible for a mobile mass 1 to be submitted to mechanical stress generating displacements in the plane, along axes x and/or y. Such displacements may result in irreversible deformations of strain gauges 3, thus making the force sensor impossible to use. To overcome this disadvantage, and as provided in patent FR 2941533, it is advantageous to limit the displacements of mobile mass 1 in the plane defined by axes x and y, by combining torsionally-deformable elements 2 with flexibly-deformable elements, both types of deformable elements being deformable around axis x. Indeed, torsionally-deformable elements provide a good resistance to displacements along axis x while having a weakness regarding displacements along axis y. Simultaneously, flexibly-deformable elements provide a good resistance to displacements along axis y while having a weakness regarding displacements along axis x. Thus, both types of deformable elements 2 provide complementary resistances, to displacements both along x and along y, enabling to protect strain gauges 3.

However, such a combination of deformable elements has the disadvantage of not enabling to simultaneously optimize the measurement range and the mechanical range. Measurement range means all the force values that the sensor is capable of detecting, and mechanical range means the set of values outside of which the mobile mass is stopped, in the case in point, on the substrate. The measurement range is thus included in the mechanical range. Ideally, the upper limit of the mechanical range is greater by a few tens of percents than that of the measurement range.

In the case of a combination of flexibly and torsionally deformable elements, the mechanical sensitivity is low, so that the mechanical range is much larger than the measurement range, the ratio between the two ranges typically being 10.

To better match the two ranges, two solutions are possible.

The first solution comprises bringing the substrate closer to the mobile mass, which, all other things being equal, decreases the mechanical range. This may be done by decreasing the thickness of the oxide layer separating the layer where the mobile mass is etched from the substrate. This first solution is however not sufficient since there exists a lower limit, corresponding to a 300-nm thickness, below which it becomes difficult to release the oxide layer by chemical techniques, and below which the risk for the mobile mass to bond to the substrate considerably increases.

The second solution to make the measurement range closer to the mechanical range is to increase the mechanical sensitivity. The latter, called $S_m$, corresponds to the maximum displacement of the mobile mass along axis z, per force unit. This variable can be expressed according to force F applied to the mobile mass, to distance $D_g$ between the center of gravity of the mobile mass and the swivel axis, to length L of the mobile mass, and to stiffness K of the deformable elements by means of the following relation:

$$S_m = \frac{FD_g L}{K}$$

To increase the mechanical sensitivity, the length of the mobile mass may be increased, to draw away not only the swivel axis from the center of gravity of the mobile mass, resulting in an increase of $D_g$. In spite of this, the mechanical sensitivity increase thus obtained is insufficient to have the two ranges match.

The other lever to increase the mechanical sensitivity is to decrease the stiffness of the deformable elements. Now, the stiffness of flexibly-deformable elements is greater than that of torsionally-deformable elements, for equal dimensions. It is thus desirable to choose the torsionally-deformable elements to increase the mechanical sensitivity of the mobile mass of a force sensor. The disadvantage resulting from this approach is that the strain gauges are submitted to stress along axis y, which may irreversibly damage them.

Those skilled in the art then appear to know no solution enabling to use deformable elements of low stiffness, and thus advantageously torsionally-deformable elements, in a force sensor with out-of-plane displacements, which provides a mechanical sensitivity such that the mechanical range is sufficiently close to the measurement range, while protecting the strain gauges against mechanical stress due to the application of transverse forces, that is, in plane x-y, and mainly along axis y, on the mobile mass.

SUMMARY

One of the aims of the present invention is to provide a force sensor with out-of-plane displacements out of the plane defined by axes x and y, resistant to stress in the plane defined by axes x and y of the mobile mass and having a high mechanical sensitivity.

To achieve this, the present invention aims at a micro-electromechanical device formed from a semiconductor substrate having its layers defining planes along axes x and y, the axis perpendicular to the layers defining an axis z, said device comprising:
- at least one anchoring area which is fixed with respect to the substrate, and
- at least one mobile mass, capable of displacing out of the substrate plane along axis z by rotation around a swivel axis directed along axis x, and
- at least one deformable element, the deformable element connecting the mobile mass to the anchoring area,
- at least one means for detecting the displacement of the mobile mass.

The mobile mass of this device has two portions. A first portion, which forms a support structure, is connected to the anchoring area by the deformable element, and the second portion forms the main body of the mobile mass. The first and second portions are connected by at least two flexible portions forming decoupling springs fastened to two different sides of the first portion. The device also comprises at least one area of cooperation between the main body and the substrate, which forms a stop limiting the displacements of the main body of the mobile mass.

The use of decoupling springs connecting the main body forming a mobile mass to the support structure enables to decouple the in-plane displacements of the main body from the out-of-plane displacements of the support structure. Further, the mass of the main body is greater than that of the support structure, advantageously significantly greater, to have a greater inertia than the support structure. Thereby, a force applied to the mobile mass mainly acts on the main body of the mobile mass.

Thus, a force applied along axis y to the device causes a displacement of the main body relative to the support structure of the mobile mass, in the plane of the mobile mass. Such a displacement of the main body relative to the support structure is in particular due to an elastic deformation of the flexible portions, or decoupling springs. The flexible portions having an elasticity threshold and a rupture threshold, the stop is placed at such a distance from the main body of the mobile mass that the two thresholds are not reached. In other words, the area forming a stop becomes effective before the decoupling springs come out of their quasi-linear elastic behavior and before the different branches of the springs abut against each other. This thus enables to protect the members which detect the motion of the mobile mass, which can only admit a limited deformation amplitude.

Thus, beyond a given external force amplitude applied in the plane of the mobile mass, particularly along axis y, the main body moves in the plane of the mobile mass and along axis y with respect to the mobile mass until it comes into contact with the stop. In this case, the energy due to this motion under the effect of the external force is absorbed by the collision with the stop. For lower external force amplitudes applied in the plane of the mobile mass, particularly along axis y, the main body of the mobile mass moves little, or not at all, and all the energy associated with the application of the force external to the device is dissipated in the anchoring areas.

In practice, a plurality of geometries may be envisaged for the relative arrangement of the support structure and of the main body of the mobile mass. Thus, the support structure may form an outer frame surrounding the main body, which then forms the inner body of the mobile mass. Conversely, it is also possible for the main body to be arranged at the periphery of the support structure, which then forms a central beam around which the main body is distributed.

The deformable element connecting the mobile mass to the anchoring area is advantageously selected from among torsionally-deformable elements to provide a lower stiffness and increase the mechanical sensitivity of the force sensor. Thereby, the device according to the invention guarantees a high mechanical sensitivity of the force sensor and protects the strain gauges against mechanical stress in the plane defined by axes x and y, and mainly along axis y.

Various geometries may be envisaged to form the decoupling springs. In each case, the decoupling spring are provided to have a strong stiffness along direction z, thus providing a synchronized motion, of same amplitude along direction z, of the main body and of the support structure. In other words, the stiffness along z of the flexible portions is such that the main body and the support structure are permanently substantially in a same plane. On the other hand, the decoupling springs are also provided to have a low stiffness in the plane defined by axes x and y, particularly along axis y, allowing motions in the plane of the main body relative to the support structure. The decoupling provided by the flexible portions, or decoupling springs, thus comprises selectively distributing the external forces applied to the mobile mass. In particular, the components along z of the external forces applied to the mobile mass generate no deformation of the flexible portions, while the components along x and y of the external forces applied to the mobile mass may generate deformations of the flexible portions.

Thus, according to an embodiment, the flexible portions are spaced apart by a distance along axis y greater than half the length along axis y of the main body of the mobile mass.

Such a spacing between the flexible portions or decoupling springs enables to maintain the main body and the support structure permanently in a same plane.

According to an embodiment, at least two flexible portions extend across more than half the width, along axis x, of the mobile mass.

This condition relative to the length enables to decrease the stiffness along axis y of the flexible portions or decoupling springs, without for all this significantly decreasing the stiffness along direction x of the decoupling springs.

Different geometries meet the criteria discussed hereabove for flexible portions forming decoupling springs.

Thus, the flexible portions may be flexibly-deformable beams. This simple geometry enables to easily form beams having dimensions providing a strong stiffness along axis z, and a low stiffness along axis y. Such beams also have a strong stiffness along axis x.

According to a specific embodiment, the flexible portions comprise a plurality of consecutive segments having a non-zero angle relative to one another.

Such flexible portions or decoupling springs are advantageous since they enable to further decrease the stiffness of the spring along a preferred direction, particularly along direction y, while keeping a strong stiffness along axis z and, by a lesser extent, along axis x.

According to an embodiment, the device comprises at least four flexible portions, said flexible portions being arranged two by two opposite each other. Such a geometry enables to make the decoupling as symmetrical as possible along axis y, which results in a more homogeneous distribution of the strain and a better resistance to temperature variations.

The stops anchored in the substrate and placed opposite the inner body of the mobile mass, at a distance enabling to avoid reaching the breaking point of the flexible portions, and even, advantageously, the elasticity limit of the flexible portions, may be formed in different ways.

Thus, according to an embodiment, the device according to the invention comprises at least one area forming a stop for the main body of the mobile mass, the stop being arranged in front of the side of the mobile mass located opposite to the anchoring area.

Different shapes may further be envisaged to form the stop.

Thus, according to a first specific embodiment, the device may comprise at least one area forming a stop for the main body of the mobile mass, said stop being a pillar anchored on the substrate and fitting into a recess of the main body of the mobile mass.

According to a second specific embodiment, the stop may have a T shape in top view.

According to another embodiment, the lateral sides of the stop have convex portions.

The existence of convex projections on the sides of the stop and opposite convex portions on the mobile mass enables to minimize the contact surfaces between the mobile mass and the stop, and thus bonding risks, while maximizing the robustness of the interacting elements. Thus, the convex portions facing each other on the sides of the stop and on the sides of the mobile mass enable to distribute the energy of mechanical shocks in a way less prejudicial for the integrity of the force sensor.

Various embodiments may be envisaged for the positioning of the stops forming stopping areas for the inner body of the mobile mass.

In a first case, it is possible for the main body of the mobile mass to have a recess having a shape substantially complementary to that of the stop. In other words, the stop is fixed with respect to the substrate, and integrates in a housing provided for this purpose in the mobile mass. Advantageously, convex portions may be provided on the lateral sides or on the opposite surface of the recess, by providing a space sufficient for the contacts between the stop and the mobile mass to be as local as possible. A good strain distribution is thus provided, which thus limits bonding risks, and risks for debris to appear.

As a variation, in another case, it is also possible to form the stop fixedly attached to the mobile mass, and protruding out of the main body, to displace in a recess formed in a fixed portion of the substrate. It is always possible to give the stop such a structure as to have convex portions even when the stop is anchored to the substrate, but located outside of the main body of the mobile mass.

To guide the mobile mass in its motion along axis z and to minimize shocks due to mechanical stress along axis x, the device according to the invention may comprise areas forming lateral stops arranged opposite the lateral sides of the mobile mass.

Advantageously, the areas forming lateral stops have rounded projections, to better distribute forces in case of a collision with the mobile mass, thus avoiding damaging it.

To protect mechanical strain gauges both along axis x and along axis y, it is possible to arrange at least two flexible portions or decoupling springs along perpendicular directions, at least a first flexible portion being directed along axis x and at least a second flexible portion being directed along axis y.

BRIEF DESCRIPTION OF THE DRAWINGS

The present invention will be better understood on reading of the following description provided as an example only in relation with the accompanying drawings, where the same reference numerals designate the same or the like elements, among which:

FIG. 3 is a top view of a force sensor with an out-of-plane displacement according to a second embodiment; and FIG. 4 is a top view of a decoupling spring integrated in the force sensor with an out-of-plane displacement according to the second embodiment; and FIG. 5 is a top view of a force sensor with an out-of-plane displacement according to a third embodiment; and FIG. 6 is a top view of a force sensor with an out-of-plane displacement according to a fourth embodiment; and FIG. 7 is a top view of a force sensor with an out-of-plane displacement according to a fifth embodiment.

Certain elements of the drawings have been enlarged to make their understanding easier and may accordingly be out of scale.

DETAILED DESCRIPTION

A micro-electromechanical device forming a force sensor with out-of-plane displacements enabling to have an increased mechanical sensitivity while protecting the strain gauges, dedicated to the measurement of the displacements of a mobile mass, against mechanical stress due to unwanted motions of the mobile mass in the plane formed by axes x and y, will now be described. Reference will be made to "out-of-plane" displacements to designate displacements occurring along axis z and to "in-plane" displacements to designate displacements occurring in the plane defined by axes x and y.

Figure 1:
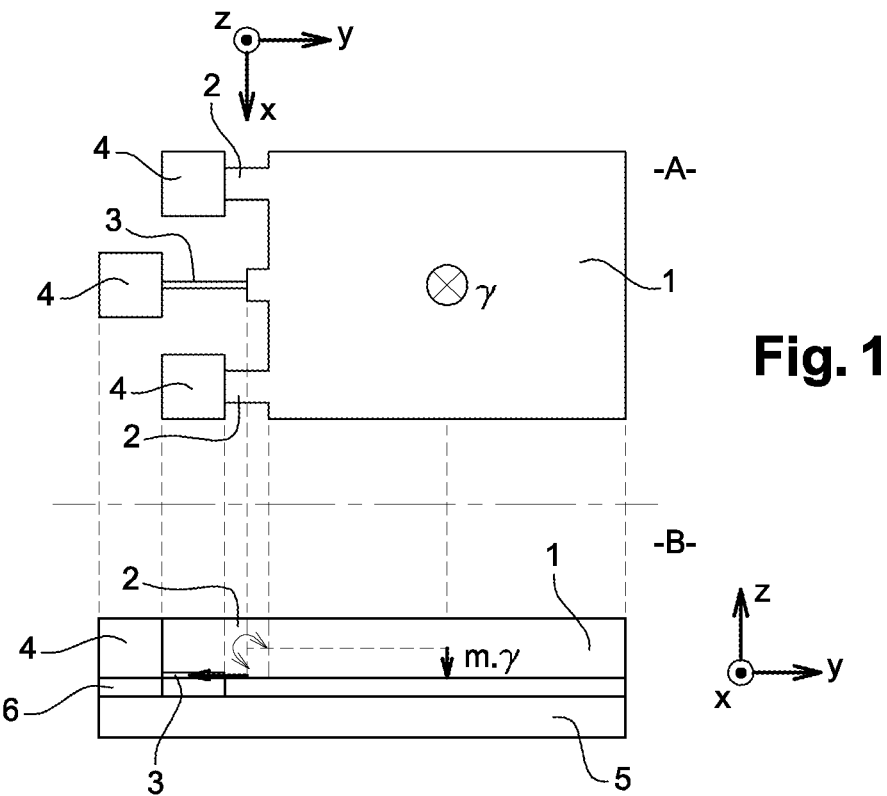
FIGS. 1A and 1B are top and side views of a prior art force sensor with an out-of-plane displacement.
Figure 2:
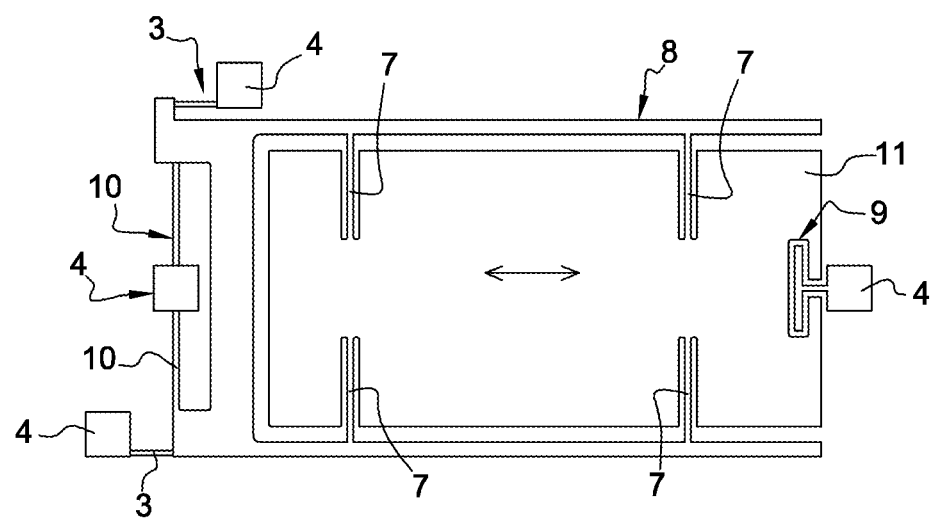
FIG. 2 is a top view of a force sensor with an out-of-plane displacement according to a first embodiment.

As shown in FIG. 2, the invention comprises at least one anchoring area 4, connected by strain gauges 3, sensitive in compression and tension, and by torsionally-deformable elements 10, to a mobile mass which may be broken up into two portions: a first portion or support structure, which is formed of an outer frame 8, and a second portion or main body of the mobile mass, which is formed of a lower body 11. The mass of inner body 11 amounts to more than half of the total mass of the mobile mass. Inner body 11 thus has a greater inertia than outer frame 8. The two portions are interconnected via at least two flexibly-deformable elements called decoupling springs 7. Decoupling springs 7 are configured to allow a decoupling of the motions of inner body 11 from those of outer frame 8 in the plane; while strongly binding the out-of-plane motions of these two portions. Thus, outer frame 8 and inner body 11 are permanently substantially in a same plane, but the displacements in this same plane of inner body 11 and of outer frame 8 may be different.

As shown in FIG. 2, the force sensor according to the invention comprises, at the end opposite to that comprising anchoring area 4 and torsionally-deformable elements 10, an area forming a stop 9, having inner body 11 of the mobile mass coming in contact therewith due to external forces of high amplitude, applied in the plane along axis y. Stop 9 comprises an anchoring 4 to the substrate, and may take different shapes. In FIG. 2, stop 9 has a T shape, in top view, but other geometries may be envisaged for stop 9. In FIG. 7, stop 9 is arranged inside of a recess formed in inner body 11 of the mobile mass. It is however possible to place the stop opposite a side of the inner body of the mobile mass without forming a recess in the inner body of the mobile mass.

Inner body 11 comes into contact with stop 9 when the external forces applied to the system in the plane have an amplitude greater than a threshold value, determined by the geometric properties of the device, particularly the mass of inner body 11, the stiffness of decoupling springs 7, and the distance separating inner body 11 from stop 9. In this case, decoupling springs 7 are tensed to their maximum allowed by the geometry of the device along axis y, and most of the energy associated with the application of the external force along y to the device is dissipated in this collision between inner body 11 and stop 9. Outer frame 8 may further be submitted to the effects of the external force along y applied to the device, by dissipating part of the energy introduced by this force via anchoring areas 4. However, the effects of the external force along y applied to the device on outer frame 8 are slight as compared with the effects of this force on inner body 11.

Decoupling springs 7 have an elasticity limit, beyond which flexion deformations are irreversible, and a breaking point, beyond which decoupling springs 7 break. Stop 9 is arranged opposite inner body 11 of the mobile mass at a distance such that the flexion deformations of decoupling springs 7 are below the breaking point and advantageously below the elasticity limit Thereby, the force sensor has a lengthened lifetime.

It will be within the abilities of those skilled in the art to apply the same principle to protect a force sensor against external forces applied to the device along axis x.

In the embodiment of FIG. 2, decoupling springs 7 are flexibly-deformable beams. Decoupling springs 7 are arranged on different sides of inner body 11, and advantageously spaced apart along axis x and y by a distance enabling to prevent torsion deformations of decoupling springs 7. This distance advantageously corresponds to at least half the total length of inner body 11 of the mobile mass. Indeed, a poorly adapted positioning of decoupling springs 7, that is, decoupling springs 7 too close to each other or arranged on a same side of inner body 11, would allow a decoupling of the motions of inner body 11 and of outer frame 8 outside of the plane, thus altering all the displacement measurements of strain gauges 3. According to the embodiment illustrated in FIG. 2, the force sensor according to the invention has four decoupling springs 7, facing each other two by two, thus more strongly binding outer frame 8 to inner body 11, outer frame 8 and inner body 11 then permanently being substantially in a same plane. A plurality of decoupling springs 7 may be placed between inner body 11 and outer frame 8, and the springs may be arranged so that they are not opposite one another.

FIG. 3 illustrates a force sensor according to the invention according to another embodiment, particularly differing from the embodiment of FIG. 2 in that decoupling springs 117 are structured in segments connected to one another to form S waves, giving flexible portion 117 a zigzag geometry. Decoupling springs 117 are arranged at opposite ends of inner body 111 of the mobile mass, on opposite sides of inner body 111. A top view of decoupling spring 117 is shown in FIG. 4.

Decoupling springs 117 shown in FIGS. 3 and 4 have the advantage of having a low stiffness for in-plane deformations along axis y and a strong stiffness for deformations along axis x or axis z.

As illustrated in FIG. 3, decoupling springs 117 have a length along axis x greater than half the width of inner body 111 of the mobile mass. This enables to ensure an efficient decoupling while providing an optimized freedom of flexion deformation along axis y.

The shape of outer frame 18 shown in FIG. 3 differs from that of outer frame 8 shown in FIG. 2. It will be within the abilities of those skilled in the art to select a large variety of different shapes for the outer frame, provided that its mass amounts to a percentage smaller than 50% of the total mass of the mobile mass, and more particularly, that the mass of the outer frame is significantly lower than that of the inner body of the mobile mass.

The force sensor shown in FIG. 3 has lateral stops in the form of convex projections 139, located close to anchoring area 14, opposite the lateral sides of the mobile mass. Lateral stops 139 may be used to guide the mobile mass, to further limit the displacements thereof along axis x. Similarly, additional stops 129 formed of convex projections may be arranged on either side of stop 119 located at the end opposite to anchoring area 14. Additional stops 129 form an additional security to stop inner body 111 of the mobile mass in too significant displacements along axis y.

As shown in FIG. 3, stop 119 may advantageously comprise convex lateral sides. In this embodiment, the recess formed in inner body 111 of the mobile mass has a shape substantially complementary to that of stop 119. The convex portions of stop 119 are not opposite a recess of complementary concave shape in the diagram of FIG. 3, but may be so according to other embodiments, not shown. The use of convex portions on the lateral sides of stop 119 and on those of the opposite mobile mass enables to avoid damaging inner body 111 of the mobile mass during displacements along axis y causing a shock of the mobile mass against stop 119.

According to a specific embodiment, shown in FIG. 5, one or more pairs of decoupling springs directed along axes x and y may be combined to allow a decoupling of displacements occurring both in the plane along axis x and along axis y. Stops 229 are advantageously arranged opposite two adjacent sides of the mobile mass.

FIG. 6 illustrates an alternative embodiment using two decoupling springs 337, 307 of different nature, that is, bent beams 307, connecting inner body 311 of the mobile mass to external frame 38 of the mobile mass close to the end of inner body 311 of the mobile mass opposite to anchoring area 34; and a decoupling spring 337 called "accordion spring". Decoupling spring 337 appears in the form of at least four segments interconnected to form a diamond structure, connected by two opposite ends, on the one hand, to outer frame 38 and, on the other hand, to inner body 311 of the mobile mass. "Accordion" decoupling spring 337 is configured so that the connections to inner body 311 and to outer frame 38 are aligned along axis y.

FIG. 7 provides a fifth embodiment of the force sensor according to the invention, where the two ends along axis y of inner body 411 of the mobile mass are connected to outer frame 48 by "accordion" decoupling springs 437. Pillar-shaped stops 429 anchored in substrate 5 are arranged within a recess formed in inner body 411 of the mobile mass.

Figure 8:
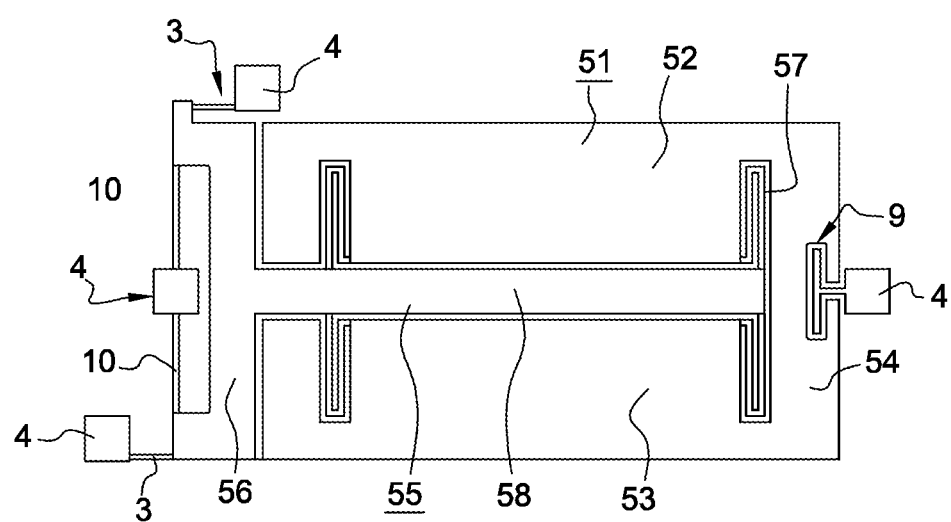
FIG. 8 is a top view of a force sensor with an out-of-plane displacement according to a sixth embodiment.

An alternative construction is shown in FIG. 8, where the relative positionings of main body 51 and of support structure 58 have been inverted with respect to the embodiment of FIG. 2. More specifically, support structure 55 appears in the form of a central beam 58 extending perpendicularly from transverse beam 56, itself connected to anchoring areas 4. Main body 51 is distributed around central beam 58 and has two lateral portions 52, 53, connected at their opposite ends to anchoring areas 4 by a transverse portion 54. Springs 57 are distributed symmetrically on the surfaces along central beam 58, and connect this central beam to lateral portions 52, 53 of the main body. As in the embodiment of FIG. 2, stop 9 comprises an anchoring area 4 to the substrate, and is arranged within a recess formed in transverse beam 54 of main body 51 of the mobile mass. Of course, the central or peripheral positioning of the main body may be used in the different embodiments described hereabove.

The above-discussed invention thus provides the advantages of:
- protecting the strain gauges of a force sensor with out-of-plane displacements from mechanical stress occurring in the plane,
- guaranteeing a high mechanical sensitivity of the force sensor,
- allowing a joint motion outside of the plane of an inner body and of an outer frame forming a mobile mass, both entities permanently being substantially in a same plane,
- decoupling displacements in the plane of the inner body from those of an outer frame of a mobile mass, due to decoupling springs allowing relative displacements of the inner body with respect to the outer frame in the plane.

The invention claimed is:

1. A micro-electromechanical device formed from a semiconductor substrate having its layers defining planes along axes x and y, the axis perpendicular to the layers defining an axis z, said device comprising:
   at least one anchoring area which is fixed with respect to the substrate, and
   at least one mobile mass, capable of displacing out of the substrate plane along axis z by rotation around a swivel axis directed along axis x, and
   at least one deformable element, said deformable element connecting the mobile mass to the anchoring area,
   at least one means for detecting the displacement of the mobile mass,
   wherein the mobile mass has a first portion forming a support structure and a second portion forming the main body of the mobile mass, said first portion being connected to the anchoring area by the deformable element, said first and second portions being connected by at least two flexible portions forming decoupling springs fastened to two different sides of said first portion and in that it comprises at least one area of cooperation between the second portion and the substrate, forming a stop limiting the displacement of the second portion of the mobile mass relative to the anchoring area; and
   wherein the at least one mobile mass including both of the first and second portions displaces out of the substrate plane along the axis z by the rotation around a swivel axis directed along axis x.

2. The device of claim 1, wherein the first portion forms a frame surrounding the second portion forming the main body of the mobile mass.

3. The device of claim 1, wherein the second portion forming the main body of the mobile mass is arranged at the periphery of the first portion.

4. The device of claim 1, wherein the flexible portions are spaced apart by a distance along axis y greater than half the length along axis y of the inner body of the mobile mass.

5. The device of claim 1, wherein the flexible portions are flexibly-deformable beams.

6. The device of claim 1, wherein the flexible portions comprise a plurality of consecutive segments having a non-zero angle relative to one another.

7. The device of claim 1, wherein the device comprises at least four flexible portions, said flexible portions being arranged two by two opposite each other.

8. The device of claim 1, wherein the area forming a stop for the main body of the mobile mass is arranged in front of the side of the mobile mass located opposite to the anchoring area.

9. The device of claim 1, wherein the area forming a stop for the main body of the mobile mass is a pillar anchored on the substrate and fitting into a recess of the main body of the mobile mass.

10. The device of claim 8, wherein the stop has a T shape in top view.

11. The device of claim 8, wherein the lateral sides of the stop have convex portions.

12. The device of claim 8, wherein the main body of the mobile mass has a recess with a shape substantially complementary to that of the stop.

13. The device of claim 8, wherein areas forming lateral stops are arranged opposite the lateral sides of the mobile mass.

14. The device of claim 13, wherein the areas forming lateral stops have projections of rounded shape.

15. The device of claim 1, comprising at least one first flexible portion along axis x and at least one second flexible portion along axis y.

* * * * *